United States Patent [19]

Kato et al.

[11] Patent Number: 4,795,921
[45] Date of Patent: Jan. 3, 1989

[54] LOGIC OPERATION-OSCILLATION CIRCUIT

[75] Inventors: Masakazu Kato; Koichi Futsuhara, both of Omiya, Japan

[73] Assignee: The Nippon Signal Co., Ltd., Tokyo, Japan

[21] Appl. No.: 725,571

[22] Filed: Apr. 22, 1985

[30] Foreign Application Priority Data

Apr. 23, 1984 [JP] Japan .............................. 59-59556[U]
Mar. 12, 1985 [JP] Japan .............................. 60-34123[U]

[51] Int. Cl.⁴ .................... H03K 19/007; H03K 17/08
[52] U.S. Cl. .................................. 307/442; 307/482; 371/14; 361/92; 361/10
[58] Field of Search ................ 307/350, 354, 360–361, 307/442, 445, 303; 340/660, 661, 663; 361/86, 90, 92, 101, 10, 13; 371/14; 331/173; 357/51

[56] References Cited

U.S. PATENT DOCUMENTS

| | | | |
|---|---|---|---|
| 3,383,522 | 5/1968 | Apfelbeck et al. | 361/92 X |
| 3,390,279 | 6/1968 | Hodges | 307/442 X |
| 3,421,018 | 1/1969 | Martin | 307/442 |
| 3,508,078 | 4/1970 | Komamiya et al. | 307/442 |
| 4,322,634 | 3/1982 | Kaire et al. | 307/442 X |
| 4,555,742 | 11/1985 | Gray et al. | 361/101 X |

FOREIGN PATENT DOCUMENTS

| | | | |
|---|---|---|---|
| 29121 | 3/1977 | Japan | 307/442 |
| 57-4764 | 11/1982 | Japan | 307/350 |
| 2086060 | 5/1982 | United Kingdom | 361/92 |

OTHER PUBLICATIONS

Mauro J. Walker–"Compatible Technique for Formation of Thin Tantalum Film Resistors on Si I.C."–May 1966–pp. 472–476–IEEE Transactions on Electrons Devices, vol. ED-13, No. 5.

William F. Davis–"Bipolar Design Considerations for the Automotive Environment", Dec. 1973–pp. 419–426–IEEE Journal of Solid States Circuits-vol. SC-8, No. 6.

Primary Examiner—Stanley D. Miller
Assistant Examiner—Tai Van Duong
Attorney, Agent, or Firm—Lowe, Price, LeBlanc, Becker & Shur

[57] ABSTRACT

In an "AND" logic operation-oscillation circuit in which an oscillating output is produced when a signal of a voltage higher than the voltage of a circuit power source is applied a diffused resistor is used for a resistor to which a voltage lower than the circuit power source is applied and a non-diffused resistor is used for a resistor to which a voltage higher than the voltage of the circuit power source is applied, whereby there is constructed a fail-safe circuit in which a short circuit trouble is not caused even if an input signal of a level higher than the voltage of the circuit power source is applied and a phenomenon that an oscillating output is produced even in the absence of an input signal is prevented. In the case where there are laid out a plurality of input signal lines, a conductor maintained at a voltage level lower than the threshold value for initiation of oscillation is arranged between two adjoining non-diffused resistors so that when a short circuit trouble is caused between the non-diffused resistors, an input signal is caused to low in the conductor and the input level is reduced to a low level incapable of producing an oscillating output.

16 Claims, 4 Drawing Sheets

LOGIC OPERATION-OSCILLATION CIRCUIT

FIELD OF THE INVENTION

The present invention relates to a fail-safe "AND" logic operation-oscillation circuit to be used for a logical circuit for control of railway signals or control of pressing machines. More particularly, the present invention relates to an "AND" logic operation-oscillation circuit which causes oscillation when a signal or signals having a predetermined value exceeding a power source voltage is put in the circuit.

BACKGROUND OF THE INVENTION

A fail-safe "AND" logic operation-oscillation circuit which oscillates only when the level of an input signal (or a plurality of signals) has a predetermined value and which does not oscillate when an input signal does not have a predetermined high level or when a problem takes place in the input signal is proposed, for example, in Japanese Utility Model Application Laid-Open Specification No. 57-4764.

This "AND" logic operation-oscillation circuit is fabricated by using a plurality of semiconductor elements and a plurality of resistors so that oscillation is not caused when a problem such as breaking or short circuit takes place in circuit elements, and in general, the input signal level is set at a value higher than the power source voltage.

In an integrated circuit fabricated by forming a plurality of circuits with circuit elements on a semiconductor substrate, a resistor portion ordinarily has a structure as shown in FIG. 1. Namely, an N-type region 2 is formed on a P-type substrate 1 so that the region 2 is electrically insulated from the substrate 1, and a P-type diffused resistor 3 is formed on the N-type region 2. In order to produce an electric insulation between the N-type region 2 and the P-type diffused resistor 3, a maximum voltage in the integrated circuit is applied to the N-type region 2 through terminals a and b to cause reverse bias in the diode junction between the region 2 and the resistor 3. An oxide film 4 of silicon dioxide (SiO$_2$) is formed on the surface of the entire assembly.

In the case where an "AND" logic operation-oscillation circuit is integrated in the above-mentioned manner, in which the level of an input signal is set at a value higher than the power source voltage as in the above-mentioned "AND" logic operation-oscillation circuit if a voltage of an input signal higher than the power source voltage is applied to the resistor portion connected to an input signal terminal, the diode junction between the N-type region 2 and P-type diffused resistor 3 of the resistor portion is biased in the forward direction of the electric current and the function of the resistor is not performed. This disadvantage will be eliminated if the voltage to be applied for reverse biasing of the above-mentioned diode junction is made equal to the maximum voltage of the input signal. In this case, however, if a trouble of short circuit problem is caused in the diode junction, the state is same as the state where an input signal of a level higher than the power source voltage is put in, and in spite of the absence of an input signal, an oscillating output is produced and no fail-safe effect is attained.

SUMMARY OF THE INVENTION

It is a primary object of the present invention to provide a fail-safe "AND" logic operation-oscillation circuit, the majority of which can be fabricated by a semiconductor integrated circuit, though the apparatus consists of a circuit using an input signal having a level higher than a power source voltage.

In the "AND" logic operation-oscillation circuit of the present invention, in order to attain this object, diffused resistors are used for resistors to which a voltage lower than the circuit power source voltage is applied and non-diffused resistors are used for resistor to which a voltage higher than the circuit power source voltage is applied.

In the "AND" logic operation-oscillation circuit of the present invention, only non-diffused resistors are arranged outside a semiconductor integrated circuit and diffused resistors and other circuit elements are arranged within the integrated circuit, whereby a fail-safe circuit is fabricated.

In the "AND" logic operation-oscillation circuit of the present invention, a conductor maintained at a voltage level lower than the threshold value for initiation of oscillation of the oscillation circuit is arranged between every two adjacent non-diffused resistors of a plurality of non-diffused resistors connected to a plurality of input signal lines receiving voltage signals higher than a circuit power source voltage, whereby if short circuit is a caused between two non-diffused resistors, the short circuit is effected through the conductor arranged therebetween and at least one of the input levels to the non-diffused resistors is reduced to the voltage level of the conductor, that is, the voltage level lower than the threshold value for initiation of oscillation of the oscillation circuit, so that the input requirement for oscillation of the oscillation circuit is not satisfied and the oscillation output is not produced while exerting the fail-safe effect.

DETAILED DESCRIPTION OF THE PREFERRED EMBODIMENTS

Figure 1:
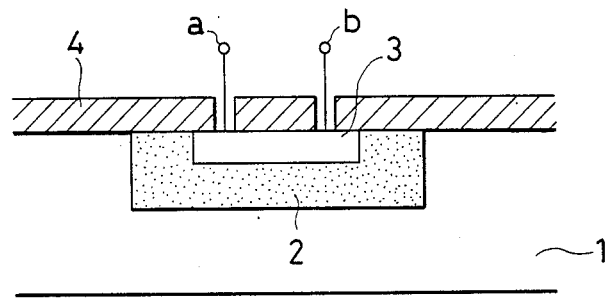
FIG. 1 is a sectional view of an integrated circuit comprising a diffused resistor formed on a substrate.
Figure 2:
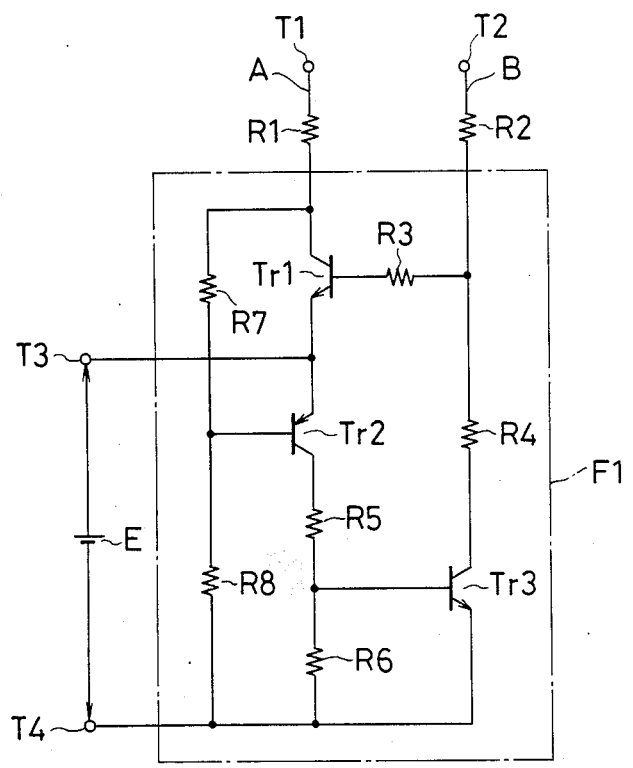
FIG. 2 is a diagram showing a first embodiment of an "AND" logic operation-oscillation circuit according to the present invention.

In an "AND" logic operation-oscillation circuit according to the first embodiment of the present invention, which is shown in FIG. 2, two signals for "AND" logic operation are put in two input terminals T1 and T2, respectively, and this circuit comprises transistors Tr1 through Tr3 and resistors R1 through R8. Resistors R1 and R2 are non-diffused resistors, and circuits and circuit elements thereof other than the resistors R1 and R2 are built into a semiconductor integrated circuit surrounded by a one-point chain line F1 in FIG. 2.

A voltage of a power source E is applied between terminals T3 and T4, and the terminal T3 is a hot side (or positive) terminal and the terminal T4 is a cold side (or negative) terminal. The transistors Tr1 and Tr3 are of the NPN type and the transistor Tr2 is of the PNP type having a complementary relation to the transistors Tr1 and Tr3.

The transistor Tr1 has a collector connected to the terminal T1 through the resistor R1 and an emitter connected to an emitter of the transistor Tr2 and also to the terminal T3, and the base of the transistor Tr1 is connected through the resistor R3 to a connecting point of two resistors R2, R4 which are connected in series between a collector of the transistor Tr3 and the terminal T2. The transistor Tr2 has a collector connected to the terminal T4 through the resistors R5 and R6 and an emitter connected to the emitter of the transistor Tr1 and the terminal T3, and a base of the transistor Tr2 is connected to a connecting point of two resistors R7, R8 which are connected in series between the collector of the transistor Tr1 and the terminal T4.

The transistor Tr3 has a collector connected to the terminal T2 through the resistors R4 and R2 and to the base of the transistor Tr1 through the resistors R4 and R3. Transistor Tr3 further has an emitter connected to the terminal T4, and a base connected to a connecting point of two resistors R5, R6 which is arranged between the collector of the transistor Tr2 and the terminal T4.

Each of the resistors R3 through R8 is a diffused resistor. Since a voltage higher than the power source voltage is applied to the resistors R1 and R2 through the terminals T1 and T2, the resistors R1 and R2 are formed of a non-diffused resistor, for example, an external resistor, a carbon film resistor, a resistor of a metal film such as a nickel-chromium or tantalum nitride film, or a sinterred metal resistor such as a ruthenium oxide, silver-palladium or platinum-palladium, so that a short circuit problem is prevented. In this case, since an arrangement is made so that when the voltage of the resistors R1 and R2 is reduced the voltage level applied to the resistors R7 and R3 is barely higher than the power source voltage the resistors R3, R7 may be formed of a diffused resistor. If a voltage considerably higher than the power source voltage is applied to the resistors R3 and R7, also these resistors R3 and R7 should also be non-diffused resistors.

In the "AND" logic operation-oscillation circuit having the above-mentioned structure, since the resistors R1 and R2 are non-diffused resistors, other circuit elements R3 through R8 and Tr1 through Tr3 and connecting circuits for these elements can be formed into a semiconductor integrated circuit, and even if a problem such as breaking or short circuit is caused to occur in any of the circuit elements other than the resistors R1 and R2, oscillation is not caused.

In this "AND" logic operation-oscillation circuit, if one or both of the input signals to the terminals T1 and T2 do not reach a level higher than the power source voltage E, each of the transistors Tr1 through Tr3 is kept "ON" or "OFF". On the other hand, if both of the input signals to the terminals T1 and T2 are at a predetermined level higher than the power source voltage, the respective transistors act in a manner of Tr2 "OFF"→Tr3 "OFF"→Tr1 "ON"→Tr2 "ON"→Tr3 "ON"→Tr1 "OFF"→Tr2 "OF" . . . and oscillation is caused.

The present invention can be applied to not only a threshold value oscillator as in the above embodiment but also to other oscillating circuits, such as a window comparator which oscillates only when the input level is within a predetermined region. Moreover, the present invention can be applied to an oscillating circuit which oscillates to a single input signal or a plurality of input signals.

Furthermore, the present invention can be applied to a circuit in which input signals to the terminals T1 and T2 are positive voltage and a circuit in which these input signals are negative voltage. In this case, for example, the NPN type transistor is changed to a transistor of the PNP type and the PNP type transistor is changed to a transistor of the NPN type, and a negative power source voltage is used.

In the present invention, since a non-diffused resistor is used for the transistor to which a voltage higher than the power source voltage is applied as pointed out above, the level of the input signal is made higher than the power source voltage. Nevertheless, circuit elements other than the above-mentioned resistors can be fabricated into an integrated circuit and a good fail-safe effect can be attained.

In the case where a plurality of input signals are put in terminals T1 and T2 arranged continuously to each other as shown in FIG. 2, even if the input resistors are resistors other than diffusion resistors which are, for example, resistors printed or vacuum-deposited on a substrate, there is a risk of a occurrence of short circuit between adjoining signal input lines because of adhesion of water drops.

In the conventional "AND" logic operation-oscillation circuit, if this problem of short circuit takes place between input signal lines, the input condition for producing an oscillation output is satisfied only by one input signal of the short-circuited input lines, and no fail-safe effect is attained.

Figure 3:
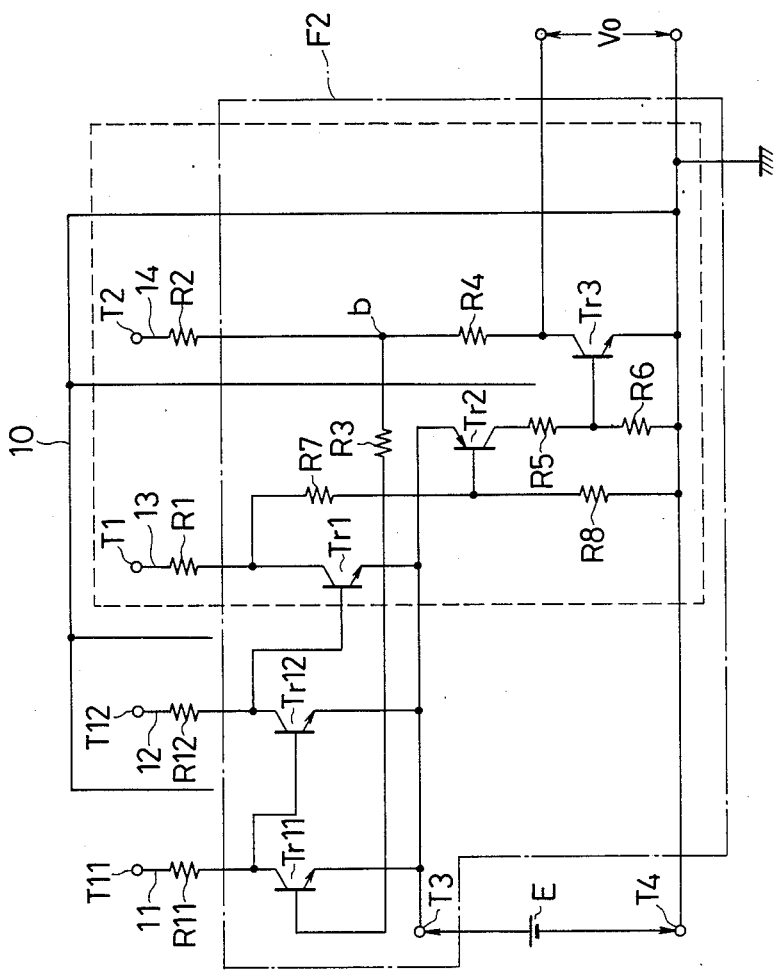
FIG. 3 is a diagram illustrating a second embodiment of an "AND" logic operation-oscillation circuit according to the present invention.

In FIG. 3 is illustrated an example of a structure in which a conductor maintained at a voltage level lower than the threshold value for initiation of oscillation is arranged between adjoining signal input lines, so that an oscillation output is not produced even if the adjoining input signal lines are short-circuited.

In this structure, when adjoining signal input lines are short-circuited, this short circuit is caused through the conductor arranged between these adjoining signal lines, and the input level of at least one signal input line is made equal to the voltage level of the conductor, that is, a level lower than the threshold value for initiation of oscillation. Accordingly, the input condition for oscillation of the logical operation oscillating circuit is not satisfied and the oscillating circuit generates no output, and hence, a fail-safe effect can be attained.

The embodiment shown in FIG. 3 concerns an oscillating circuit for operation of an "AND" logic for four inputs, and this circuit is constructed by adding resistors R11 and R12 and transistors Tr11 and Tr12 to the oscillating circuit for operation of an "AND" logic for two inputs shown in FIG. 2 (the zone surrounded by the dotted line in FIG. 2). Each of the resistors R11 and R12 is a non-diffused transistor, and a voltage higher than the power source voltage E is applies to the resistors R11 and R12 through terminals T11 and T12, respectively. Collectors of the transistors Tr11 and Tr12 are connected to the terminals T11 and T12 through the resistors R11 and R12, respectively, and emitters of the transistors Tr11 and Tr12 are connected to the terminal T3 and the emitter of the transistor Tr2. The voltage at the point b, which is formed by dividing the input voltage by the transistors R2 and R4, is applied to the base of the transistor Tr11 through the resistor R3, and the collector voltage of the transistor Tr11 is applied to the base of the transistor Tr12. Each of the transistors Tr11 and Tr12 is of the NPN type. Circuit elements other than the non-diffused transistors R1, R2, R11 and R12 and connecting lines are built in a semiconductor circuit surrounded by a one-point chain line F2.

In the present embodiment, the conductor maintained at a voltage level lower than the threshold value for initiation of oscillation is an earth line 10 connected to the earth and having a zero level, and this earth line 10 is arranged between every two adjacent lines of first to fourth signal input lines 11 through 14 connecting the input terminals T1, T2, T11 and T12 to the transistors Tr1, Tr3, Tr11, and Tr12, respectively. The length of the earth line 10 is set to the length between each of the input terminals and the collectors of the transistors.

The operation of the present embodiment will now be described.

In the case where the circuit is kept in the normal state, when input voltages V1, V2, V3 and V4 of predetermined levels higher than the power source voltage E are put in the respective input terminals T11, T12, T1 and T2, the respective transistors Tr1 through Tr3, Tr11 and Tr12 repeat the following ON-OFF operations to cause oscillation.

Namely, when the transistor Tr11 is in the "ON" state, the respective transistors act in a manner of Tr12 "OFF"→Tr1 "ON"→Tr2 "ON"→Tr3 "ON"→Tr11 "OFF"→Tr12 "ON"→Tr1 "OFF"→Tr2 "OFF"→Tr3 "OFF"→Tr11 "ON" . . . and oscillation is caused.

Incidentally, in the circuit of the present embodiment, input signal voltages are set within a range producing an oscillation output.

Namely, if the input signal voltages V1 and V2 of the input terminals T11 and T12 and the input voltage V3 and V4 of the input terminals T1 and T2 satisfy the following requirements (1) through (3), respectively, oscillation is caused:

$$V1 > E1, V2 > E2 \quad (1)$$

$$V3 > [(R1+R7+R8)/R8]E \quad (2)$$

and $$E < V4 < [(R2+R4)/R4]E \quad (3)$$

In the above formula, R1 through R8 represent resistance values of the resistors R1 through R8, respectively.

The formula (2) represents the condition for turning off the transistor Tr2 when the transistor Tr1 is turned off, and the formula (3) represents the condition for turning off the transistor Tr11 when the transistor Tr3 is turned on.

In the above-mentioned circuit when a short circuit is going to be caused between two adjacent signal input lines by water drops or the like, short circuit should inevitably be caused between the earth line arranged between the two adjacent input signal lines and one of these two signal input lines, and the voltage of the short-circuited signal input line is reduced to the zero level.

Accordingly, the input condition is not satisfied and any oscillation output is not produced, and an error owing to short circuit between signal input lines is prevented and a fail-safe function is exerted.

In the present embodiment, the conductor is connected to the earth so that the zero level is maintained. However, any level lower than the threshold value for initiation of oscillation can be optionally adopted and set for the conductor.

The above-mentioned short-circuiting action of the earth line 10 can be applied not only to the case where the resistors R1, R2, R11 and R12 are resistors other than diffused resistors but also the case where they are formed as diffused resistors on a semiconductor integrated circuit.

Figure 4:
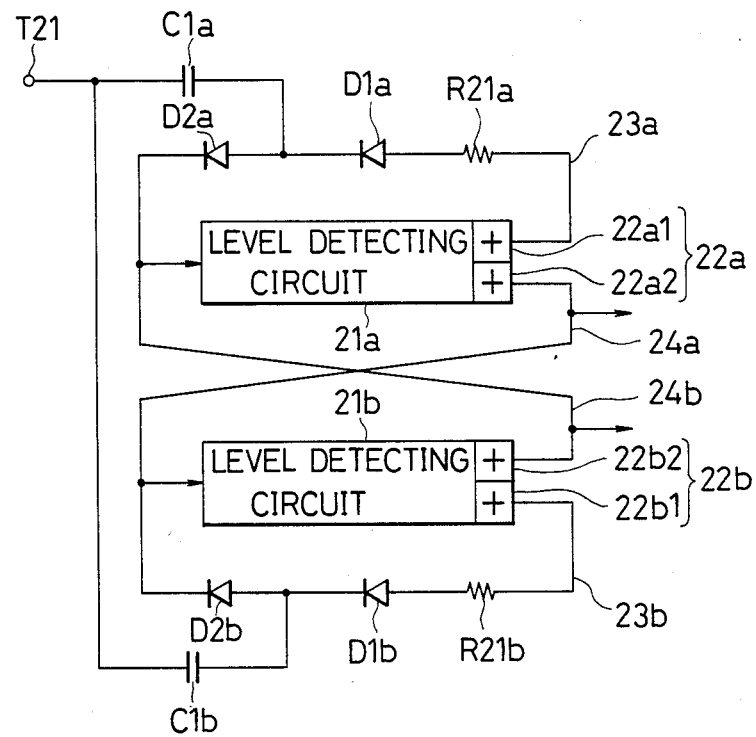
FIG. 4 is a block diagram illustrating a bistable circuit comprising the "AND" logic operation-oscillation circuit of FIG. 2 according to the present invention.

FIG. 4 illustrates a bistable circuit comprising the "AND" logic operation-oscillation circuit of the present invention shown in FIG. 2. In this bistable circuit, the "AND" logic operation-oscillation circuit shown in FIG. 2 is arranged in a circuit for detecting a level of an asymmetric error, and especially, the circuit is a flip-flop circuit comprising two level detecting circuits including a window comparator, two rectifying devices for rectifying outputs of the level detecting circuits and two feedback circuits for feeding back outputs of the rectifying devices to the level detecting circuits.

In FIG. 4, the circuit shown comprises first and second level detecting circuits 21a and 21b for detecting a level of an asymmetric error, first and second rectifying devices 22a and 22b for rectifying outputs of the level detecting circuits 21a and 21b, and first and second feedback circuits 23a and 23b for feeding back outputs of the rectifying devices 22a and 22b to the corresponding level detecting circuits 21a and 21b to effect self-retention. The output of the first rectifying device 22a is put in the second level detecting circuit 21b through a cross circuit 24a and the output of the second rectifying device 22b is put in the first level detecting circuit 21a through a cross circuit 24b, and a trigger signal is put in a terminal (T21).

Each of the first and second level detecting circuits 21a and 21b is constructed by a known window comparator which produces an output only when the level of the input signal is within a specific range and produces an asymmetric output pattern when a circuit problem such as breaking or short circuit is caused to occur.

This window comparator consists of an oscillating circuit as shown in FIG. 2 and the window comparator is put the outputs of the rectifying devices 22a and 22b at the terminals T1 and T2, respectively, and the output of this window comparator is used, for example, as the collector output of the transistor Tr2.

This window comparator having the above-mentioned structure oscillates only when the voltage at the point (A) and the voltage at the point (B) shown in FIG. 2 simultaneously satisfy the following conditions of the formula (4) and (5), respectively:

$$V21 > \frac{R1 + R7 + R8}{R8} \cdot E \quad (4)$$

and $$\frac{R2 + R4}{R4} \cdot E > V21 > E \quad (5)$$

wherein V21 represents a level of an input signal to the terminals T1 and T2.

When no signal is input to the terminals T1 and T2, the transistor Tr2 is kept in the "ON" state and the above oscillation is not caused. However, if a signal satisfying the above conditions simultaneously is put in the terminals T1 and T2, the transistors Tr1, Tr2 and Tr3 perform an ON-OFF operation to cause oscillation.

Accordingly, in this window comparator, the transistor Tr1 and the resistor R1 for the collector of the transistor Tr1 forms a level detecting circuit for detecting a lower level of the input signal to the terminal T1, and the transistor Tr3 and the resistors R2 and R4 for the collector of the transistor Tr3 form a level detecting circuit for detecting a higher level of the input signal to the terminal T2.

The first and second rectifying devices have two rectifying circuits 21a1 and 22a2 and two rectifying circuits 22b1 and 22b2, respectively. In the first rectifying device 22a, the output terminal of one rectifying circuit 22a1 is connected to a feedback circuit 23a and the output terminal of the other rectifying circuit 22a2 is connected to a cross circuit 24a. In the second rectifying device 22b, the output terminal of one rectifying circuit 22b1 is connected to a feedback circuit 23b and the output terminal of the other rectifying circuit 22b2 is connected to a cross circuit 24b.

Each of the rectifying circuits 22a1, 22a2, 22b1 and 22b2 is a known so-called asymmetric error circuit which is constructed so that when a circuit problem such as breaking or short circuit is caused, the output voltage becomes zero. In this rectifying circuit, as shown in FIG. 5 illustrating an example of this rectifying circuit, there are arranged a transistor Tr21 receiving the output of the level detecting circuit of the precedent stage on the base thereof, a transformer 25 having a primary coil connected to the collector of the transistor Tr21 and a positive terminal of the power source, a bridge circuit 26 having four diodes D31 through D34 and a 4-terminal output capacitor C2 located on the output side of the bridge circuit 26, and a secondary coil of the transformer 25 is connected to the input side of the bridge circuit 26.

Figure 5:
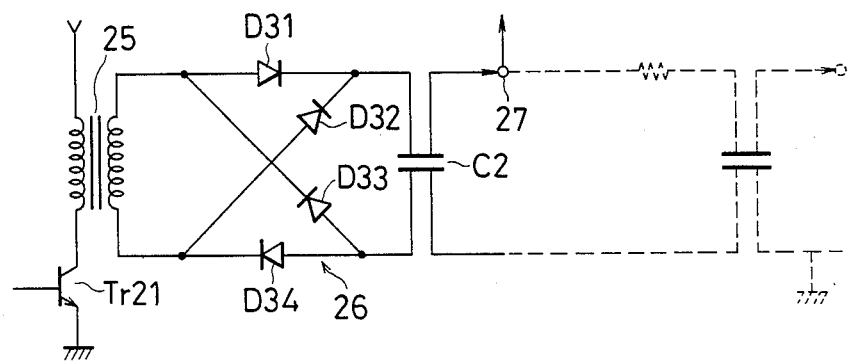
FIG. 5 is a circuit diagram illustrating an example of the rectifying circuit of FIG. 4.

In the rectifying circuit shown in FIG. 5, if a short circuit or an opening problem takes place in any of the transistor Tr21 and the transformer 25, an alternating current signal is not input to the bridge circuit 26, and if a short circuit trouble or opening circuit takes place in any of the capacitor C2 and the diodes D31 through D34, the voltage of the terminal 27 becomes zero or is lowered. Accordingly, the terminal 27 is connected to the corresponding rectifying circuits 23a and 23b or the opposite level detecting circuits 21a and 21b.

The outputs of the rectifying circuits 22a2 and 22b2 are maintained at a level higher than the upper limit value of the range where the opposite level detecting circuits 21a and 21b oscillate.

In each of the feedback circuits 23a and 23b, the resistor R21a or R21b is connected in series to two diodes D1a and D2a or D1b and D2b. The portion between the diodes D2a and D1b and the portion between the diodes D2b and D2b are connected to the terminal T21 through capacitors C1a and C1b, respectively. Resistors R21a and R21b damp the levels of signals fed back to the corresponding level circuits 21a and 21b to such levels that the level detecting circuits 21a and 21b can produce alternating current outputs. The capacitors C1a and C1b input an alternating current signal to the terminal T21 as the input signal. The diodes D1a and D1b clamp the alternating current signal to the output level of the rectifying circuits 22a1 and 22b1. The diodes D2a and D2b are inserted so as to prevent occurrence of the phenomenon that when the input signal to the terminal T21 is reduced to a low level, self-retention in the corresponding level detecting circuits 21a and 21b becomes impossible.

The operation in this bistable circuit will now be described based on the supposition that the upper and lower limit values of the region (window) where the level detecting circuits 21a and 21b oscillate are Vh and Vl, respectively, the levels of the inputs to the level detecting circuits 21a and 21b are Va and Vb, respectively, no output is produced immediately after oscillation of the level detecting circuits 21a and 21b by the input pulses because rising output responses of the rectifying circuits 22a1, 22a2, 22b1 and 22b2 are delayed, and that oscillation is caused by rising responses of the rectifying circuits 22a1 and 22b2 to produce outputs in the rectifying circuits 22a1 and 22b1.

If the level detecting circuit 21 oscillates and the level detecting circuit 21b does not oscillate, the relations of Vh>Va>Vl and Vb>Vh are established.

If a positive pulse if input to the terminal 21 in this state, the inlet signal level Va in the first level detecting circuit 21a becomes higher than the level Vh and oscillation is stopped. Accordingly, the output of the cross circuit becomes zero, and if the input level Vb to the second detecting circuit 21b satisfies the condition of Vh>Vb>Vl, the input passes through the second detecting circuit 21b, and oscillation is caused to effect self-retention, with the result that the input level Va of the first level detecting circuit 21a is maintained at a level higher than Vh and oscillation is reversed.

Figure 6:
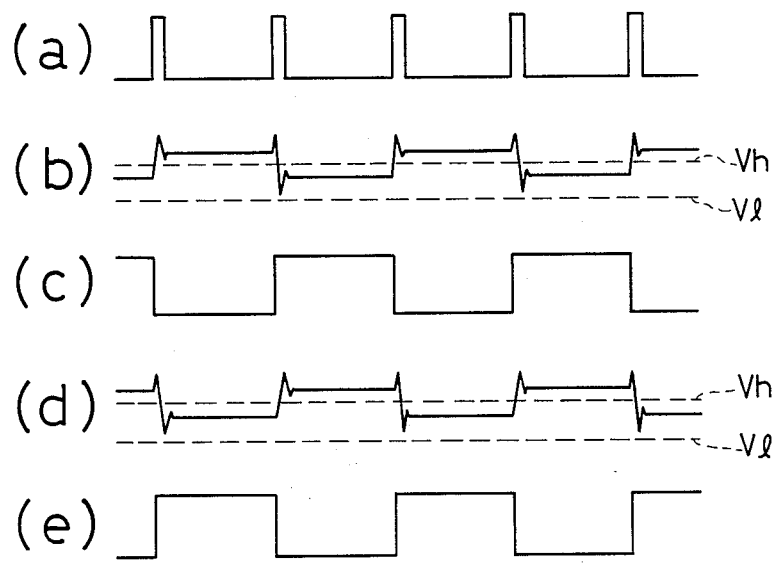
FIG. 6 is a time chart showing the operation of the bistable circuit shown in FIG. 4.

Accordingly, if a trigger signal shown in FIG. 6-(a) is put in this bistable circuit, the input level Va to the first level detecting circuit 21a forms a signal shown in FIG. 6-(b) and the input level Vb to the second level detecting circuit 21b forms a signal shown in FIG. 6-(d), while the output of the first rectifying device 22 forms a signal shown in FIG. 6-(c) and the output of the second rectifying device 22b forms a signal shown in FIG. 6-(e).

Also in the above-mentioned bistable circuit acting as a flip-flop circuit, the logical operation oscillating circuit apparatus of the present invention can be applied as the level detecting circuits 21a and 21b. Also in this embodiment, a non-diffused resistor is used for the resistor to which a voltage higher than the circuit power source voltage is applied, whereby occurrence of a short circuit phenomenon in the resistor is prevented.

We claim:

1. An "AND" logic operation-oscillation circuit which comprises a circuit power source providing a voltage, a plurality of signal input lines to which a signal of a voltage higher than the voltage of the circuit power source is applied, circuit elements including at least one diffused resistor, at least one non-diffused resistor connected to the signal input lines and a plurality of semiconductors, and oscillating circuit means which oscillates and produces an oscillating output when a plurality of voltage signals including a voltage signal higher than the voltage of the circuit power source are applied to said signal input lines and which connects said circuit elements so that a voltage lower than the voltage of the circuit power source is applied to the diffused resistor and a voltage higher than the voltage of the circuit power source is applied to the non-diffused resistor, and a conductor, said conductor being situated between two adjoining non-diffused resistors and having a voltage level thereon lower than a threshold value for initiation of oscillation of said oscillating circuit means.

2. An "AND" logic operation-oscillation circuit as set forth in claim 1, wherein the conductor is earthed.

3. An "AND" logic operation-oscillation circuit which comprises a circuit power source having an input voltage, a plurality of circuit elements including at least one diffused resistor, at least a pair of non-diffused resistors and a plurality of semiconductors, and oscillating circuit means which oscillates and produces an oscillating output when a plurality of voltage signals including a voltage signal higher than the voltage of the circuit power source are applied thereto and which connects said circuit elements so that a voltage lower than the voltage of the circuit power source is applied to the diffused resistor and a voltage higher than the voltage of the circuit power source is applied to the non-diffused resistors, and a conductor means disposed between said pair of non-diffused resistors, said conductor means connected to a voltage level lower than a threshold voltage level necessary on said input terminals for initiating oscillation of said oscillating circuit.

4. An "AND" logic operation-oscillation circuit as set forth in claim 3, wherein said plurality of circuit elements are formed as an integrated circuit and only the non-diffused resistor is arranged externally to said integrated circuit.

5. An "AND" logic operation-oscillation circuit as set forth in claim 3, wherein the non-diffused resistors are composed of a metal film resistor comprising nickel-chromium or tantalum nitride.

6. An "AND" logic operation-oscillation circuit as set forth in claim 3, wherein the non-diffused resistors are composed of a sintered metal resistors comprising ruthenium oxide, platinum-palladium or silver-palladium.

7. An "AND" logic operation-oscillation circuit as set forth in claim 3, wherein the non-diffused resistors is composed of carbon film resistors.

8. An "AND" logic operation-oscillation circuit as set forth in claim 3, wherein the non-diffused by resistors are an input resistors to which a signal of a voltage higher than the voltage of the circuit power source is applied.

9. An "AND" logic operation-oscillation circuit which comprises:

a pair of power supply terminals, a first of which is receptive of a reference voltage and a second of which is receptive of a power source voltage, a plurality of input terminals for input signal each having a voltage higher than the power source voltage, a first transistor for generating an oscillation output, said first transistor having a collector connected with one of said input terminals and an emitter connected with one of said power supply terminals, first and second resistive means connected in series between said first input terminal and said collector of said first transistor, a second transistor having a collector connected with another of said input terminals, a base connected to a voltage corresponding to a voltage between said first and second resistive means and an emitter connected with said second power supply terminal, a third resistive means connected between said another input terminal and said collector of said second transistor, fourth and fifth resistive means connected in series between said collector of the second transistor and said first power supply terminal, a third transistor of a complementary structure to said second transistor, which has an emitter connected with said second power supply terminal, a collector connected to said first power supply terminal and a base connected to a voltage between said fourth and fifth resistive means, and sixth and seventh resistive means connected in series between said collector of the third transistor and said first power supply terminal, a voltage between said sixth and seventh resistive means being supplied to a base of said first transistor, said circuit being so constituted that said first and third resistive means are non-diffused resistive means and other resistive means, to which a voltage no greater than the power source level is supplied, are diffused resistive means, and a conductor positioned between mutually adjoining non-diffused resistive means and kept at a voltage level below the threshold level for generating oscillation output at said first transistor.

10. An "AND" logic operation-oscillation circuit as set forth in claim 9, wherein a part of said circuit, including said diffused resistive means and said transistors, is included in a semiconductor integrated circuit while another part of said circuit, comprising said non-diffused resistive means, is formed externally to said semiconductor integrated circuit.

11. An "AND" logic operation-oscillation circuit as set forth in claim 9, wherein each of said non-diffused resistive means is composed of a metal film resistor comprising nickel-chromium or tantalum nitride.

12. An "AND" logic operation-oscillation circuit as set forth in claim 9, wherein each of said non-diffused resistive means is composed of a sintered metal resistor comprising ruthenium oxide, platinum-palladium or silver-palladium.

13. An "AND" logic operation-oscillation circuit as set forth in claim 9, wherein each of said non-diffused resistive means is composed of a carbon film resistor.

14. In an oscillating circuit connected for oscillation when input voltages to at least two input terminals thereof are both at voltage levels higher than a level of a power supply voltage thereof, the oscillating circuit including input resistors connected to said input terminals and a plurality of interconnected circuit resistors and transistors, the oscillating circuit including means operable during oscillation thereof for connecting the circuit resistors to voltage levels lower than the power supply voltage and the input resistors to voltage levels higher than the power supply voltage thereof, the improvement comprising:

a circuit structure for said oscillating circuit wherein said input resistors comprise non-diffused resistors connected to the input terminals, and said circuit resistors comprise a plurality of diffused resistors provided in said oscillating circuit, and a conductor means connected to a voltage level lower than a threshold voltage level necessary on said input terminals for initiating oscillation of said oscillating circuit, wherein said conductor means is disposed between said non-diffused resistors, thereby separating said non-diffused resistors by a voltage level insufficient to initiate oscillation, whereby oscillation of said oscillating circuit due to short-circuit between said non-diffused resistors is prevented, said oscillating circuit means thereby providing said voltage levels higher than the power supply voltage only to said non-diffused resistors and said voltage levels lower than the power supply voltage to said diffused resistors.

15. An improved oscillating circuit as recited in claim 14 further comprising a semiconductor integrated circuit chip including said circuit resistors and said transistors and wherein said non-diffused resistors are external to said semiconductor integrated chip.

16. An improved oscillating circuit as recited in claim 14
wherein said conductor means is disposed between adjacent ones of said non-diffused resistors,
thereby preventing oscillation of said oscillating circuit due to short-circuit between said adjacent non-diffused resistors.

* * * * *

UNITED STATES PATENT AND TRADEMARK OFFICE
CERTIFICATE OF CORRECTION

PATENT NO.  : 4,795,921

DATED       : January 3, 1989

INVENTOR(S) : Masakazu KATO, and Koichi FUTSUHARA

It is certified that error appears in the above-identified patent and that said Letters Patent is hereby corrected as shown below:

On the title page, item [54] and column 1, line 2,
the Title of the Invention should read as follows:

"AND" LOGIC OPERATION-OSCILLATION CIRCUIT

Signed and Sealed this

Twelfth Day of December, 1989

Attest:

JEFFREY M. SAMUELS

*Attesting Officer*     *Acting Commissioner of Patents and Trademarks*